US010673367B2

(12) United States Patent
Eke et al.

(10) Patent No.: US 10,673,367 B2
(45) Date of Patent: Jun. 2, 2020

(54) APPARATUS AND METHOD FOR CONTROLLING AN OSCILLATING DEVICE

(71) Applicant: Dialog Semiconductor (UK) Limited, London (GB)

(72) Inventors: David Eke, Dalkeith (GB); Vladislav Vasilev, Edinburgh (GB); David Tyndall, Edinburgh (GB); Julian Tyrrell, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 178 days.

(21) Appl. No.: 15/464,547

(22) Filed: Mar. 21, 2017

(65) Prior Publication Data

US 2018/0159545 A1    Jun. 7, 2018

(30) Foreign Application Priority Data

Dec. 6, 2016  (GB) .................................. 1620746.6

(51) Int. Cl.
| H02P 25/032 | (2016.01) |
| H02P 7/03 | (2016.01) |
| H03L 5/00 | (2006.01) |
| H03L 7/099 | (2006.01) |
| G08B 6/00 | (2006.01) |

(Continued)

(52) U.S. Cl.
CPC .............. H02P 25/032 (2016.02); G08B 6/00 (2013.01); H02P 7/04 (2016.02); H03L 5/00 (2013.01); H03L 7/099 (2013.01); *H02P 6/182* (2013.01); *H02P 6/28* (2016.02)

(58) Field of Classification Search
CPC ................................. H02P 7/04; H02P 25/032
See application file for complete search history.

(56) References Cited

U.S. PATENT DOCUMENTS 7,982,711 B2    7/2011  Anastas et al.
9,467,085 B1 *  10/2016 Murata ................. H02P 25/026
(Continued)

FOREIGN PATENT DOCUMENTS

| CN | 103620525 | 3/2014 |
| CN | 103699215 | 4/2014 |
| CN | 103793050 | 5/2014 |

OTHER PUBLICATIONS

Co-pending U.S. Appl. No. 15/464,623, filed Mar. 21, 2017, "An Apparatus and Method for Controlling and Oscillating Device," by David Eke et al., 41 pgs.

(Continued)

*Primary Examiner* — Jeffrey M Shin
(74) *Attorney, Agent, or Firm* — Saile Ackerman LLC; Stephen B. Ackerman

(57) ABSTRACT

An apparatus and method for controlling an oscillating device is presented. In particular, a controller for adjusting the frequency of a drive signal driving a haptic actuator is presented. The controller contains a calculator adapted to receive a first and a second measurement of the electrical parameter and to calculate a difference between the first measurement and the second measurement. The first measurement is obtained at a first sampling time and the second measurement is obtained at a second sampling time. The controller is adapted to provide a control signal to adjust a frequency of the drive signal based on the difference.

26 Claims, 12 Drawing Sheets

(51) Int. Cl.
*H02P 6/182* (2016.01)
*H02P 6/28* (2016.01)

(56) References Cited

U.S. PATENT DOCUMENTS

| | | |
|---|---|---|
| 2012/0229264 A1 | 9/2012 | Company Bosch et al. |
| 2014/0085064 A1 | 3/2014 | Crawley et al. |
| 2014/0118126 A1 | 5/2014 | Garg et al. |
| 2015/0137713 A1 | 5/2015 | Barsilai et al. |
| 2017/0063273 A1* | 3/2017 | Murata .................. H02P 25/06 |

OTHER PUBLICATIONS

"Multiscale Curvature Matching for Smooth Polylines," by Ann Driemel, Freie Universitat Berlin, Jan. 31, 2009, 159 pages.
USPTO Office Action, U.S. Appl. No. 15/641,360, Applicant: Vasilev et al., dated May 16, 2018, 10 pages.
USPTO Office Action, U.S. Appl. No. 15/464,623, Applicant: Eke, David, dated Jun. 11, 2018, 16 pages.
USPTO Office Action, U.S. Appl. No. 15/470,157, Applicant: Eke et al., dated Aug. 23, 2018, 16 pages.
USPTO Office Action, U.S. Appl. No. 15/464,623, Applicant: Eke, David, dated Jan. 9, 2019, 16 pages.
Chinese Search Report, Application No: 2017104566426, Applicant: Dialog Semiconductor (UK) Limited, dated Dec. 26, 2019, 2 pgs.

* cited by examiner

APPARATUS AND METHOD FOR CONTROLLING AN OSCILLATING DEVICE

This application is related to Ser. No. 15/464,623, which is owned by a common assignee, and which is herein incorporated by reference in its entirety.

TECHNICAL FIELD

The present disclosure relates to an apparatus and methods for controlling an oscillating device. In particular, the present invention relates to controller for adjusting the frequency of a drive signal driving a haptic actuator.

BACKGROUND

Oscillating devices which may include haptic actuators, speakers and crystal oscillators are operated with a frequency that is characteristic of the device. Depending on the conditions, this frequency may drift for example as a function of temperature, external load conditions, or time. For this reason, it is necessary to use a control system capable of tracking the operation frequency of the device.

Haptic actuators are commonly used with electronic devices to provide the user with a sensory signal also referred to as haptic feedback. For example, mobile phones are often equipped with a haptic actuator which vibrates to provide a notification for a user upon the arrival of a text message or other similar event. To this end different types of haptic actuators have been developed, among which are the linear resonant actuator, LRA, and piezo-electric actuators.

LRAs are based on an inductive coil (solenoid) coupled to a spring holding a permanent magnet. In operation, the spring and mass system move along a single axis. When a current is passing in one direction through the coil it creates a magnetic field that repels the magnet. When passing the current in the other direction the magnetic field attracts the magnet. Hence, the transfer of energy between the spring and the coil generates oscillations. The system has a mechanical resonance frequency typically in the range of 50-300 Hz. At the resonant frequency, the push-pull drive voltage produces the maximum linear deviation of the sprung mass.

Following Lenz's law, upon oscillation of the mass, a back electromotive force, BEMF, is generated across the actuator that opposes the voltage of the source that created it. When the mass moves through the coil it follows a simple harmonic motion, which causes it to induce a sinusoidal voltage in the solenoid. This BEMF is strongest at the resonance frequency of the system. The BEMF is proportional in the first order to a drive signal driving the LRA. However, the BEMF amplitude is dependent on the weight and strength of the magnet and the number of turns of the solenoid coil. This means that the BEMF varies across LRAs and across temperature and other electro-mechanical parameters.

SUMMARY

The resonant frequency of an LRA is individual to each resonator. In addition, it also varies, by about 5-20%, with temperature and operating conditions including how the LRA is mounted for a particular application. Such variations do not necessarily change the width of the frequency response but can affect both the peak frequency and the amplitude of the oscillations. Therefore, the resonant frequency must be tracked so that a driving signal driving the oscillating device can be adjusted to maintain the optimum oscillations of the LRA.

According to a first aspect of the disclosure, there is provided a frequency controller for use with a driver for providing a drive signal to an oscillating device, and a sensor for sensing an electrical parameter of a response signal of the oscillating device, the controller comprising a calculator adapted to receive a first and a second measurement of the electrical parameter and to calculate a difference between the first measurement and the second measurement; wherein the first measurement is obtained at a first sampling time and the second measurement is obtained at a second sampling time; the controller being adapted to provide a control signal to adjust a frequency of the drive signal based on the difference.

Optionally, the first sampling time and the second sampling times are defined with respect to the drive signal.

Optionally, wherein the first sampling time and the second sampling times are provided within a half-cycle of the drive signal, or wherein the first sampling time is provided within a first half-cycle and wherein the second sampling time is provided within another half-cycle.

Optionally, the first sampling time and the second sampling time are defined such that the first measurement and the second measurement have a same value when the response signal and the drive signal have a same frequency and are in phase.

Optionally, the calculator is adapted to calculate a product signal between the drive signal and the response signal; and to sample the product signal at the first sampling time and the second sampling time to obtain the first measurement and the second measurement.

Optionally, the controller comprises a comparator adapted to compare the difference with a reference value and to generate an error signal based on the comparison.

Optionally, the controller comprises a control loop coupled to the comparator, the control loop being adapted to generate the control signal to reduce the error signal.

Optionally, the controller comprises a normaliser coupled to the calculator to normalise the difference.

Optionally, the response signal comprises a feedback component. For example, the feedback component may be back-electromotive force component.

According to a second aspect of the disclosure, there is provided a control system for use with an oscillating device comprising a response signal, the control system comprising a driver adapted to provide a drive signal to the oscillating device; a sensor adapted to sense an electrical parameter of the response signal at a plurality of sampling times associated with a sampling pattern; a controller coupled to the sensor and to the driver, the controller comprising a calculator adapted to receive a first and a second measurement of the electrical parameter and to calculate a difference between the first measurement and the second measurement; wherein the first measurement is obtained at a first sampling time and the second measurement is obtained at a second sampling time; the controller being adapted to provide a control signal to adjust a frequency of the drive signal based on the difference.

Optionally, the sampling pattern comprises at least the first sampling time and the second sampling time, and wherein the first sampling time and the second sampling times are defined with respect to the drive signal.

Optionally, the first sampling time and the second sampling times are provided within a half-cycle of the drive signal.

Optionally, the first sampling time is provided within a first half-cycle and the second sampling time is provided within another half-cycle.

Optionally, the first sampling time and the second sampling time are defined such that the first measurement and the second measurement have a same value when the response signal and the drive signal have a same frequency and are in phase.

Optionally, the calculator is adapted to calculate a product signal between the drive signal and the response signal; and to sample the product signal at the first sampling time and the second sampling time to obtain the first measurement and the second measurement.

Optionally, the control system comprises a comparator adapted to compare the difference with a reference value and to generate an error signal based on the comparison, and a control loop coupled to the comparator, the control loop being adapted to generate the control signal to reduce the error signal.

Optionally, the driver is a current driver adapted to provide a current signal and wherein the sensor is a voltage sensor.

According to a third aspect of the disclosure, there is provided an oscillating-device system comprising a control system coupled to an oscillating device having a response signal, the control system comprising a driver adapted to provide a drive signal to the oscillating device; a sensor adapted to sense an electrical parameter of the response signal at a plurality of sampling times associated with a sampling pattern; a controller coupled to the sensor and to the driver, the controller comprising a calculator adapted to receive a first and a second measurement of the electrical parameter and to calculate a difference between the first measurement and the second measurement; wherein the first measurement is obtained at a first sampling time and the second measurement is obtained at a second sampling time; the controller being adapted to provide a control signal to adjust a frequency of the drive signal based on the difference.

According to a fourth aspect of the disclosure, there is provided a method of operating an oscillating device adapted to provide a response signal, the method comprising providing a drive signal having a drive frequency to drive the oscillating device; defining a sampling pattern comprising at least a first sampling time and a second sampling time; sensing an electrical parameter of the response signal at the first sampling time to obtain a first measurement; sensing the electrical parameter at the second sampling time to obtain a second measurement; calculating a difference between the first measurement and the second measurement; and adjusting the drive signal based on the difference.

Optionally, adjusting the drive signal comprises generating a control signal to change the drive frequency.

Optionally, the control signal may be adapted to reduce the difference between the first measurement and the second measurement.

Optionally, the sampling pattern comprises at least the first sampling time and the second sampling time, and wherein the first sampling time and the second sampling times are defined with respect to the drive signal.

Optionally, the first sampling time and the second sampling times are provided within a half-cycle of the drive signal or wherein the first sampling time is provided within a first half-cycle and wherein the second sampling time is provided within another half-cycle.

Optionally, the first sampling time and the second sampling time are defined such that the first measurement and the second measurement have a same value when the response signal and the drive signal have a same frequency and are in phase.

Optionally, the method comprises comprising calculating a product signal between the drive signal and the response signal; and sampling the product signal at the first sampling time and the second sampling time to obtain the first measurement and the second measurement.

Optionally, the drive frequency may be a resonance frequency of the oscillating device.

Optionally, the method comprises normalising the difference to obtain a normalised difference and adjusting the drive signal based on the normalised difference.

BRIEF DESCRIPTION OF THE DRAWINGS

The invention is described in further detail below by way of example and with reference to the accompanying drawings, in which.

DESCRIPTION

Figure 1:
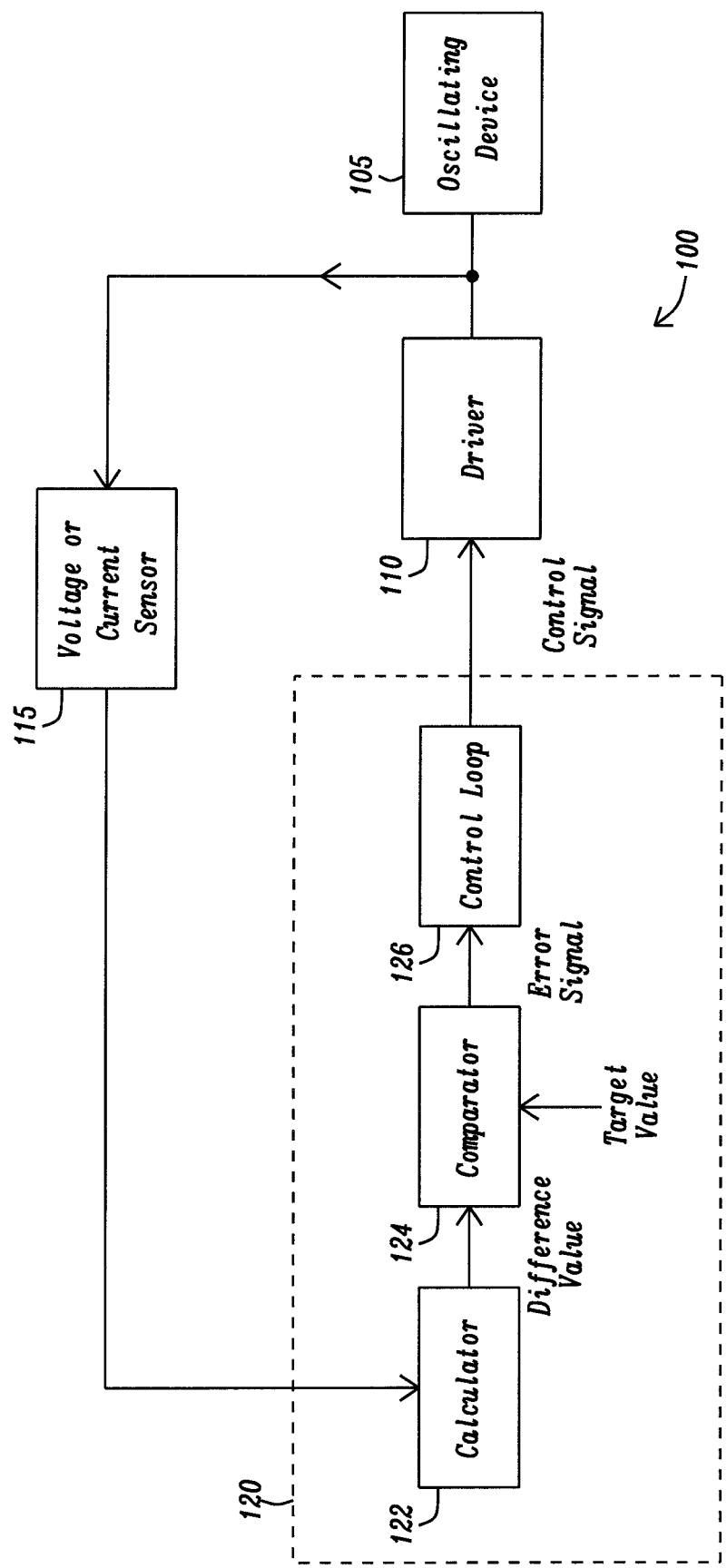
FIG. 1 is a diagram of a control system for operating an oscillating device.

FIG. 1 illustrates a control system for operating an oscillating device 105 at a target frequency. The system comprises a driver 110, a sensor 115, and a controller 120. The driver 110 is adapted to provide a drive signal to the oscillating device 105. The sensor 115 is adapted to sense an electrical parameter such as a current or a voltage of a response signal across the oscillating device 105. The controller 120 is coupled to the sensor 115 and to the driver 110. The controller 120 includes a calculator 122, a comparator 124 and a control loop 126 also referred to as an error reduction filter. The calculator 122 has an input for receiving measurement values from the sensor 115 and an output for providing a difference or delta value. The comparator 124 has a first input for receiving the difference value from the calculator 122 a second input for receiving a target value and an output for providing an error signal. The control loop 126 has an input for receiving the error signal from the comparator 124 and an output for providing a control signal to the driver 110.

The oscillating device 105 maybe any device arranged to provide inductive or capacitive oscillations. The oscillating device can also be a mechanical arrangement including a sprung magnet. For example, the oscillating device may be a speaker, a linear resonant actuator or a crystal oscillator.

The controller 120 may be implemented as a digital controller or an analog controller. For example, the controller 120 may be implemented as a phase-lock loop (PLL), either in analog or digital form. The calculator 122 may be a slope calculator to calculate a slope or gradient between two points. The control loop 126 may be implemented as a proportional integral differential PID filter.

Optionally, a normaliser, not shown, may be coupled between the calculator 122 and the comparator 124 to normalise the difference value, or between the comparator 124 and the control loop 126 to normalise the error signal. The normaliser is adapted to determine a maximum amplitude value of the response signal and to generate a normalised difference value or a normalised error signal using the maximum amplitude value.

Figure 2:
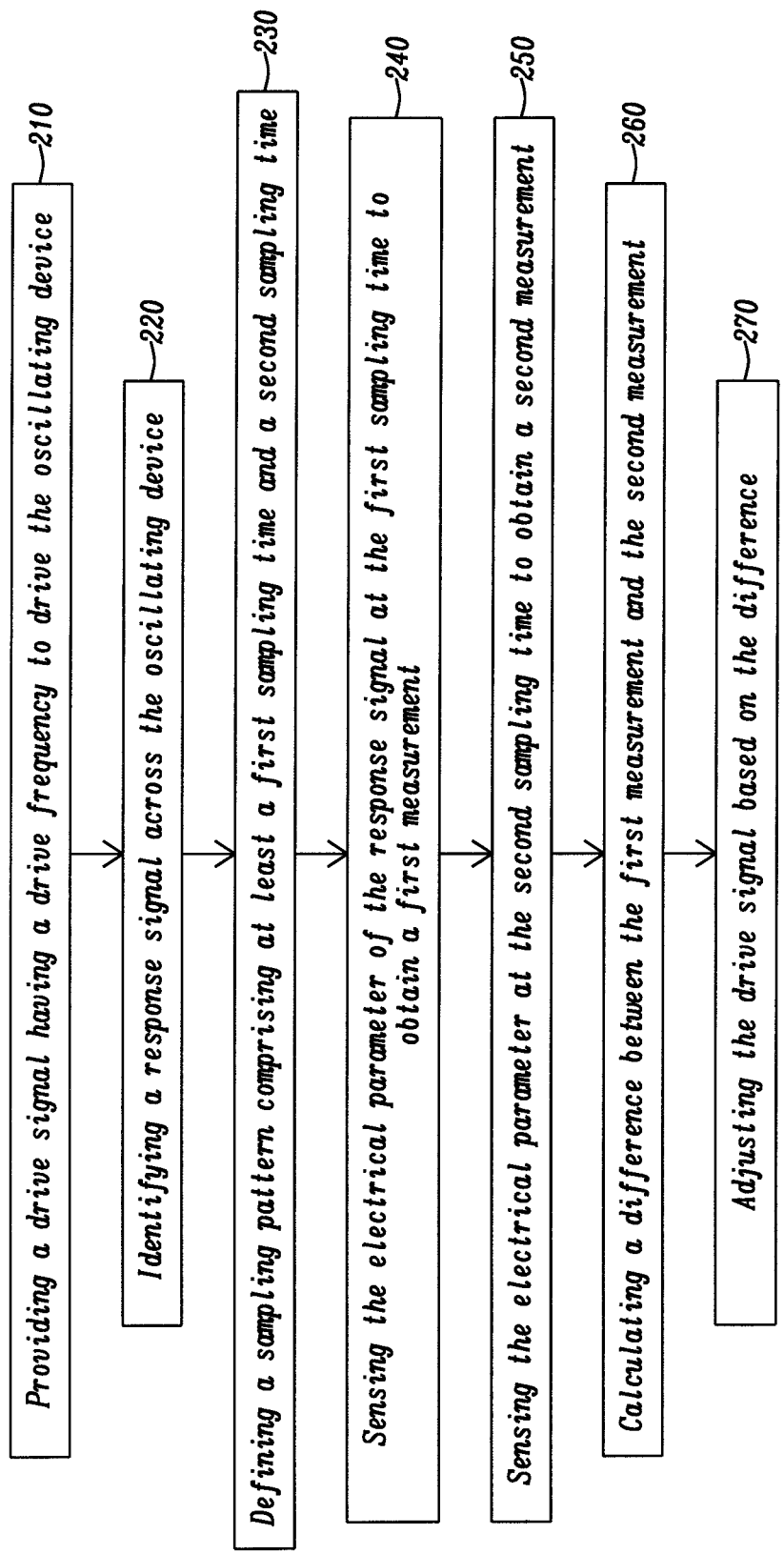
FIG. 2 is a method of operating an oscillating device.

FIG. 2 is a method of operating an oscillating device using the control system of FIG. 1.

At step 210, a drive signal is provided by the driver 110 to drive the oscillating device 105. The drive signal may be a current signal or a voltage signal with a drive frequency.

At step 220, a response signal is identified across the oscillating device having a response signal frequency. The response signal could include a drive signal component and a feedback signal component that is characteristic of the oscillating device. For example, if the oscillating device is a haptic actuator, the response signal may be a system signal that include a drive signal component and a back electromotive force component.

At step 230, a sampling pattern is defined that includes at least a first sampling time and a second sampling time. For example, the sampling pattern may be defined such that when the response signal and the drive signal have a same frequency and are in phase, then a measurement of the response signal obtained at the first sampling time is equal to another measurement of the response signal obtained at the second sampling time.

At step 240 an electrical parameter of the response signal such as a current value or a voltage value, is sensed by the sensor 115 at the first sampling time to obtain a first measurement. At step 250 the electrical parameter is sensed by the sensor 115 at the second sampling time to obtain a second measurement. At step 260, a difference between the first measurement and the second measurement is calculated by the calculator 122. The measurements may be stored in a memory. The calculator 122 can retrieve the measurement from the memory in order to perform its calculation.

At step 270 the drive signal is adjusted based on the difference. For instance, the drive frequency of the drive signal may be varied to reduce the difference between the first measurement and the second measurement. For example, the calculator 122 can provide a difference value to the comparator 124. The comparator 124 then compares the difference value with a target value and provides an error signal to the control loop 126. The control loop 126 then provides a control signal to the driver 110.

The operating frequency of the oscillating device can be tracked using at least one pair of measurements of the response signal. The pair of measurements can be monitored at different rates. For example, the pair of measurements may be monitored for every half-cycle of the response signal. Alternatively, the pair of measurements may be monitored for every N half-cycles of the response signal, in which N is an integer greater than one.

Using this approach, it is possible to track the variation in the resonance frequency of the oscillating device and to adjust the drive signal accordingly to operate the oscillating device at its present resonance frequency. This is achieved using a relatively simple system.

Figure 3:
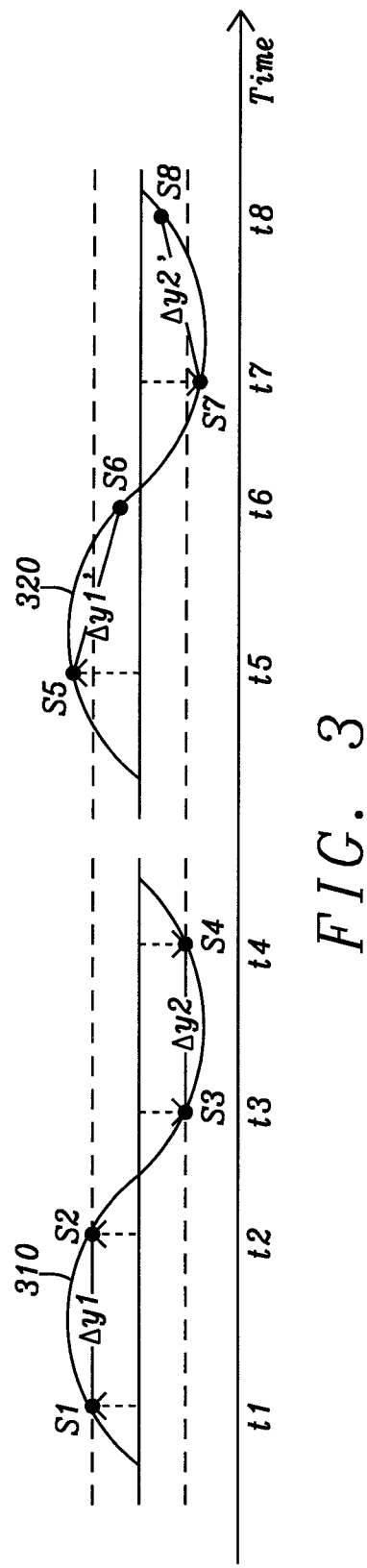
FIG. 3 is a response signal of an oscillating device having a sinusoidal profile.

FIG. 3 illustrates a response signal of an oscillating device when the response signal is in phase with the drive signal (left curve) and out of phase with the drive signal (right curve). In this example the response signal is provided by a sinusoidal waveform comprising a plurality of cycles. The waveform 310 has a same frequency as the drive signal and is in phase with the drive signal. The waveform 320 has a same frequency as the drive signal and is out of phase with the drive signal.

The response signal is sampled with a chosen sampling pattern comprising a plurality of sampling times, for examples t1, t2, t3 and t4. The sampling pattern may be defined by scheduling the measurements at a particular time with reference to the drive signal. For example, the sampling pattern may be based on the period T of the drive signal. If the feedback signal is sinusoidal it is possible to determine the sampling times by dividing the period T associated with a cycle, in a plurality of equal parts, and choosing specific points equidistant from a maximum or a minimum in each half-cycle. For example, if a cycle is divided in 8 parts, the sampling times t1, t2, t3 and t4 may be chosen at ⅛, ⅜, ⅝ and ⅞ of a cycle of the drive signal.

A pair of measurements comprises two sample points chosen in a half cycle of the response signal. Each half cycle comprises a single maximum or minimum.

The first sample point is chosen on one side of the maximum or minimum, and the second point is chosen on the other side of the maximum or minimum. The sampling times are chosen such that when the response signal is at the same frequency as the frequency of the drive signal and in phase with the drive signal, then the amplitude of the first sample point is equal to the amplitude of the second sample point.

For example, a first pair of measurements S1 (a1, t1) and S2 (a2, t2) are sampled at times t1 and t2 in a positive half-cycle of the waveform 310. In this instance the measurements S1 and S2 are equidistant to the maximum amplitude of the positive half-cycle. As a result, a difference in amplitude $\Delta y_1 = a_2 - a_1 = 0$; and the slope or gradient between S1 and S2 is null.

A second pair of measurements S3 (a3, t3) and S4 (a4, t4) are sampled at times t3 and t4 in a negative half-cycle of the waveform 320. In this example the measurements S3 and S4 are equidistant to the minimum amplitude of the negative half-cycle. As a result, a difference in amplitude $\Delta y_2 = -(a_3 - a_4) = 0$; and the slope or gradient between S3 and S4 is null.

With time, the response signal may change frequency or move out of phase with the drive signal. In this example the response signal moves out of phase with the drive signal. The response signal 320 is sampled using the same sampling pattern as defined above at times t5, t6, t7 and t8. The pairs of measurements S5 and S6 corresponding to S1, S2 in the positive have cycle and S7 and S8 corresponding the measurements S3, S4 in the negative half cycle, are shifted along the waveform 320.

The pair of measurement (S5, S6) corresponding the first pair of measurement (S1, S2) is not symmetrical around the maximum amplitude of the positive half-cycle. The difference in amplitude Δy1'=a6−a5<0 and the slope between S6 and S5 is negative. Similarly, the difference in amplitude in the negative half-cycle is calculated as Δy2'=−(a8−a7)<0. In the negative half-cycle the difference is multiplied by −1 so that the control action is consistent in direction for a given phase.

In another example, the sampling pattern is defined such that one sample point is monitored per N-half-cycles. For instance, a first sampling time t1 may be chosen in a first positive half cycle of the drive signal, and a second sampling time t2 may be chosen in a second positive half cycle of the drive signal. The first and second sampling times may correspond to a same point on the half cycle. For instance, the sampling times t1 and t2 may be chosen both at ⅛ of a cycle of the drive signal. In this case, the measurement values would be the same when the drive signal and the response signal are in phase but different when out of phase.

Figure 4:
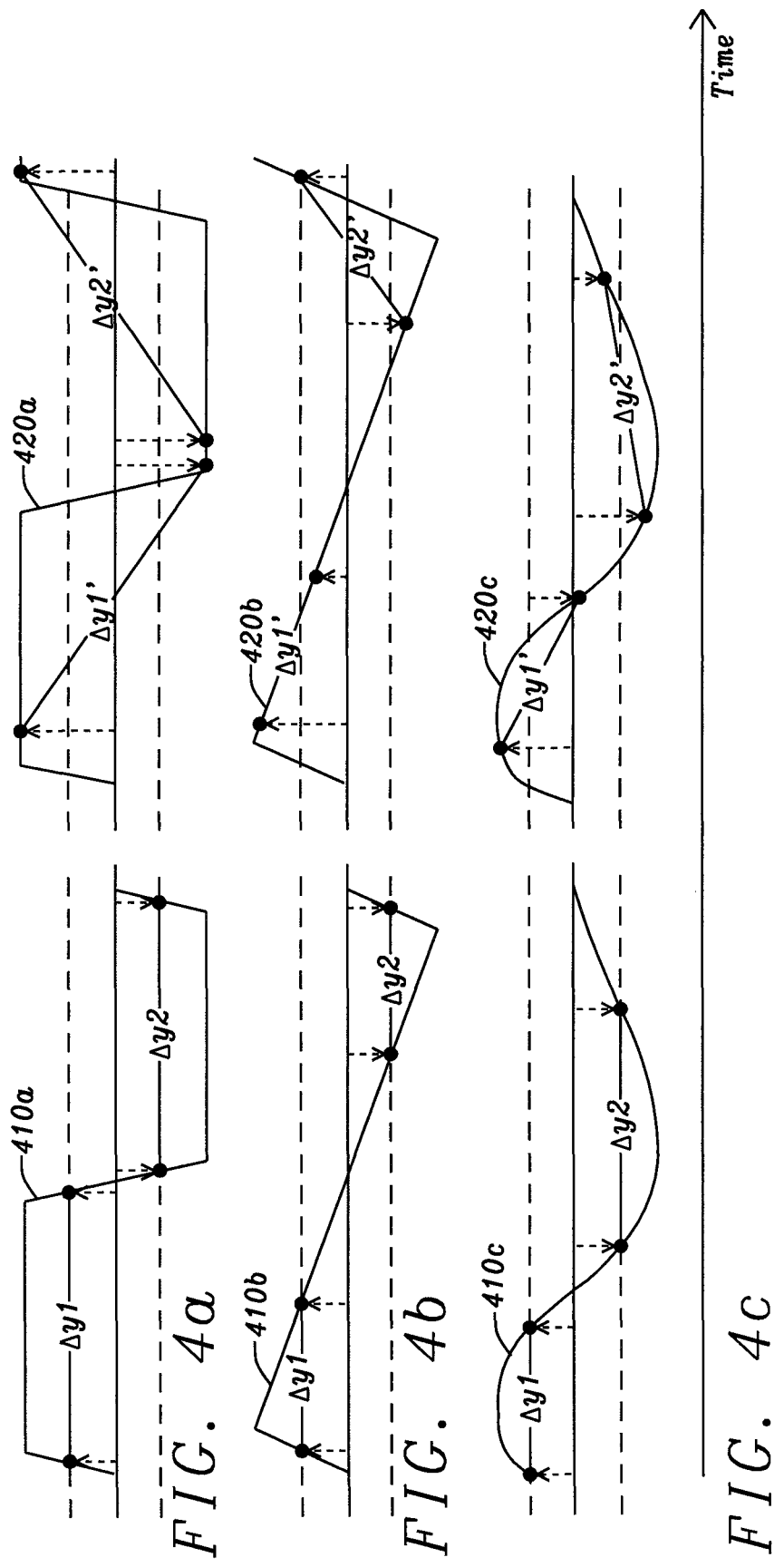
FIG. 4a is a response signal of an oscillating device having a trapezoidal profile.
FIG. 4b is a response signal of an oscillating device having a triangular profile.
FIG. 4c is a response signal of an oscillating device having an asymmetric semi-sinusoidal profile.

FIGS. 4a-4c illustrate response signals of an oscillating device having different waveform shapes. The response signals are periodic and have a plurality of cycles. Each cycle includes two half-cycles in which each half cycle has a monotonic rise and a monotonic fall.

FIG. 4a shows the example of a response signal having a trapezoidal waveform shape. The waveform 410a is in phase with the drive signal and the waveform 420a is out of phase with the drive signal.

FIG. 4b shows the example of a response signal having an asymmetric triangular waveform shape. The waveform 410b is in phase with the drive signal and the waveform 420b is out of phase with the drive signal.

FIG. 4c shows the example of a response signal having an asymmetric semi-sinusoidal shape. The waveform 410c is in phase with the drive signal and the waveform 420c is out of phase with the drive signal.

In all the above examples, the sampling pattern is chosen to obtain a gradient that is null when the response signal has a same frequency than the drive signal and is in phase and with the drive signal. As a result, when the response signal becomes either off resonance and/or changes frequency, the gradient of the sample pair becomes either positive or negative.

For example, in the case of FIG. 4b in which the response signal is an asymmetric triangular waveform, the measurements S1 and S2 are chosen such that the amplitude of S2 equals the amplitude of S1. As a result, S1 and S2 are not symmetrical with respect to the maximum amplitude of the positive half-cycle. In another example the sampling pattern could be chosen to correspond to a reference value such as a reference slope or gradient that is non-null. The system and method discussed above can be applied to the control of a haptic actuator such as an LRA.

Figure 5:
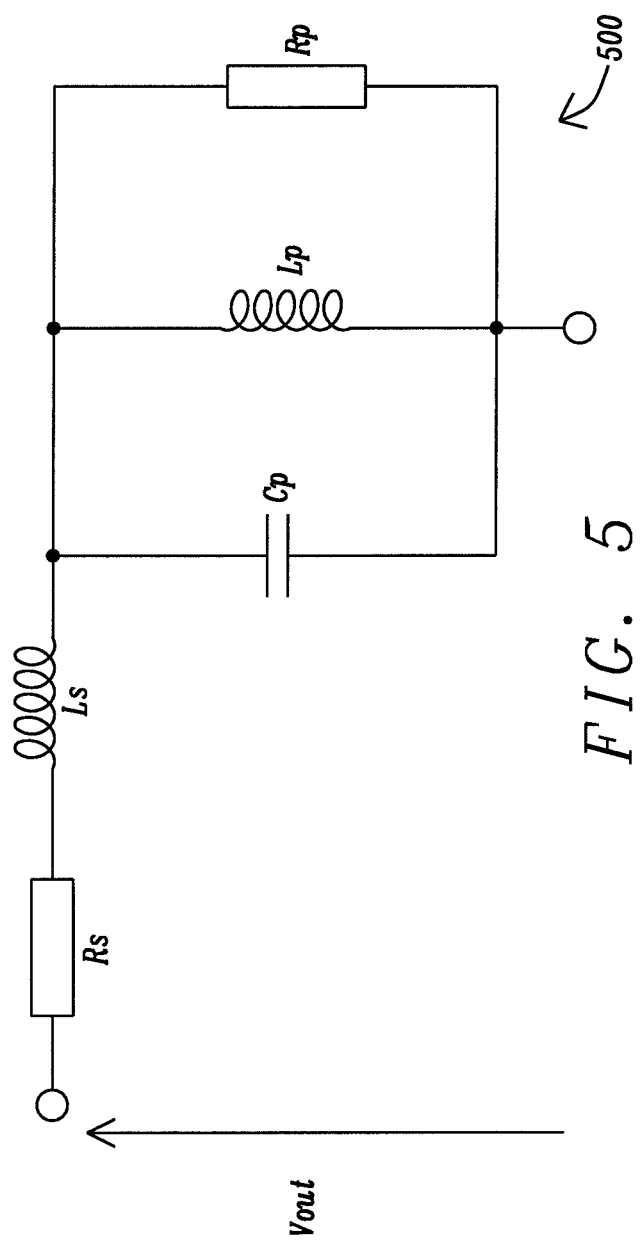
FIG. 5 is an electrical system for modelling a haptic actuator.

FIG. 5 shows an electrical system for modelling an LRA. The LRA is modelled as a first resistor Rs in series with a first inductor Ls combined with a second resistor Rp in parallel with a second inductor Lp and a capacitor Cp. The damped oscillating motion of the system formed by the spring and the magnetic mass of the LRA is represented by the components Rp, Lp and Cp. The components Rs and Ls are used to represent the electrical behavior of the internal coils (solenoid) used to attract and repel the mass of the LRA.

The circuit 500 will resonate at a frequency primarily dependent on the values of Cp and Lp. Providing the filtering effect of Rs and Ls is significantly above the resonance of the circuit then the current and voltage at resonance will be dependent purely of the sum of the resistances Rs and Rp. When driven with a drive signal approaching the resonant frequency, a LRA will resonate and produce a back electromotive force, BEMF, proportional in amplitude to the drive signal. The amplitude will build up following a low-pass filter response describing an exponential decay tending towards the final value.

Figure 6:
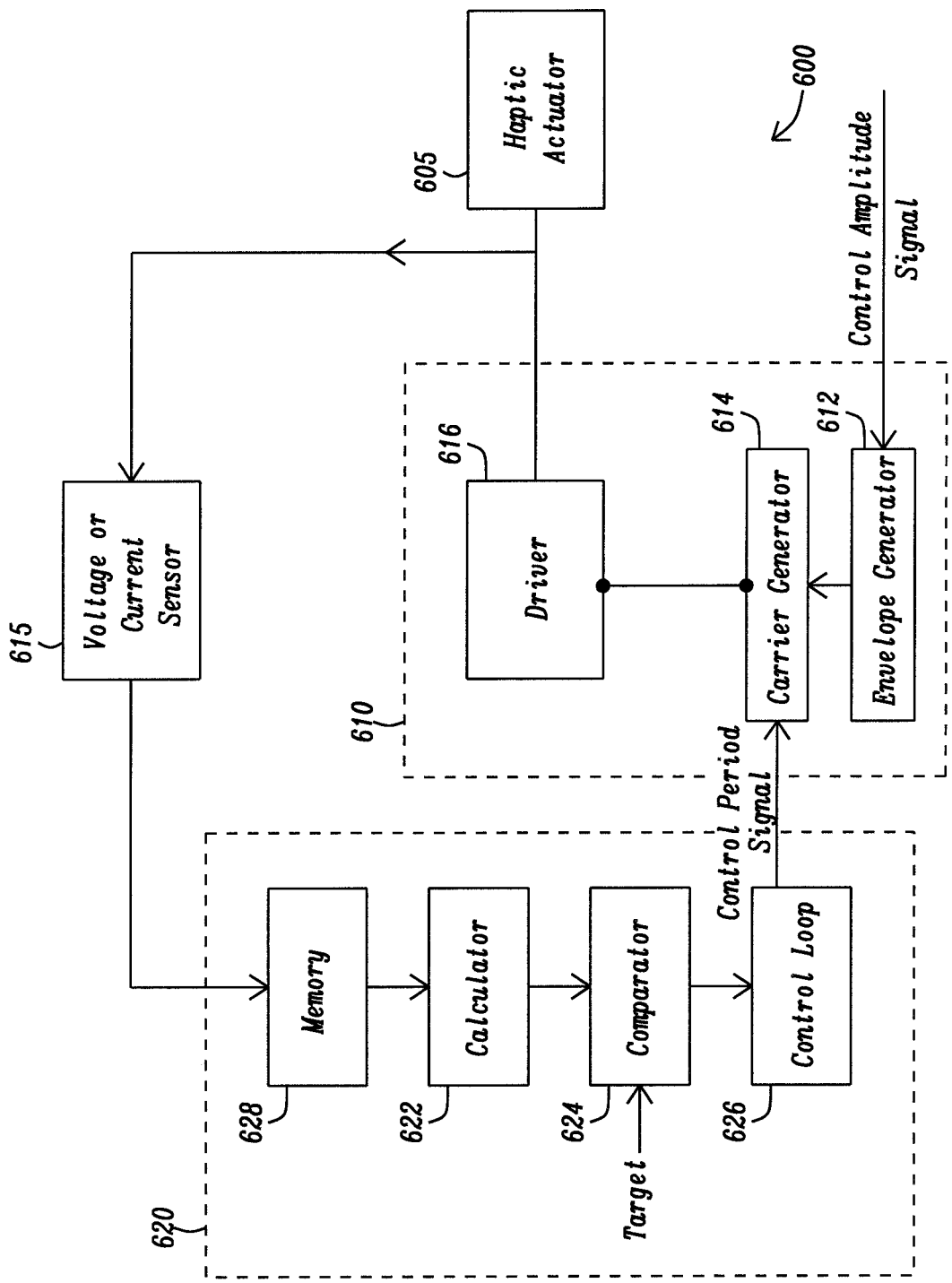
FIG. 6 is a diagram of a haptic system.

FIG. 6 illustrates a haptic system 600. The system includes a haptic actuator 605, a regulator 610, a sensor 615 and a controller 620. The haptic actuator 605 may be implemented in different ways. For example, the haptic actuator may be a device adapted to oscillate a mass such as a linear resonant actuator LRA.

The regulator 610 may be a current regulator or a voltage regulator. The regulator 610 has an input for receiving a control signal from the controller 620 and an output for providing a drive signal such as a drive current signal or a drive voltage signal to the haptic actuator 605. The regulator 610, is adapted to adjust the drive signal using the control signal from the controller 620.

The sensor 615 may be a voltage sensor or a current sensor. The sensor 615 is coupled between the haptic actuator 605 and the controller 620. The sensor 615 is adapted to sense an electrical parameter, such as a voltage or a current across the haptic actuator 605. The electrical parameter is associated with a system waveform which may be a voltage waveform or a current waveform. The sensed electrical parameter may be for example a direct voltage or a representation of the voltage such as a filtered value of the voltage. In another example the sensed electrical parameter may be for example a direct current or a representation of the current such as a filtered value of the current.

The controller 620 is coupled to the regulator 610 and to the sensor 615. The controller includes a memory 628 also referred to as register, a calculator 622, a comparator 624 and a control loop 626. The memory 628 has an input for receiving an electric parameter value from the sensor 615, and an output coupled to the calculator 622. The calculator 622 has an input for receiving measurements value from the memory 628 or directly from the sensor 615, and an output for providing a difference value. The comparator 624 has a first input for receiving the difference value from the calculator 622 a second input for receiving a target value and an output for providing an error signal. The control loop 626 has an input for receiving the error signal from the comparator 624 and an output for providing a control signal to the regulator 610. For example, the control signal may include a period parameter to change the period of the signal generated by the carrier generator 614. The controller 620 may be implemented as a digital controller or an analog controller.

As mentioned above with respect to FIG. 1, the calculator 622 may be a slope calculator to calculate a slope or gradient between two points. The control loop 626 may be implemented as a phase-lock loop PLL, or a frequency-lock loop FLL or a delay-lock loop DLL, either in analog or digital form. Optionally, a normaliser, not shown, may be coupled between the calculator 622 and the comparator 624. The normaliser is adapted to determine a maximum amplitude value of the response signal and to generate a normalised difference value using the maximum amplitude value. This normalised value is then sent to the comparator 624.

The regulator 610 comprises an envelope generator 612, a carrier generator 614 and a driver 616, such as a current driver or voltage driver. The envelope generator 612 has an input for receiving a control signal for controlling the amplitude of the drive signal. The carrier generator 614 has a first input for receiving a control signal from the control loop 626 and a second input for receiving an amplitude from the envelope generator 612. The driver 616 has an input for receiving a signal from the carrier generator 614 and an output for proving a drive signal to the haptic actuator 605.

The regulator 610 may be implemented in different fashions. For example, a current regulator may comprise a driver such as a differential H-bridge, coupled to a current control loop. The current control loop may use for example a PWM or a linear control technique.

The carrier generator 614 may be adapted to behave like a digital PLL by varying its period in accordance with the output from the control loop 626. For example, the carrier generator may be a counter with a variable roll-over value. In operation, the carrier generator 614 also receives the output from the envelope generator 612 to control the amplitude of its output signal. The driver 616 then receives the output from the carrier generator and provides a suitable current or voltage to the haptic actuator.

Figure 7:
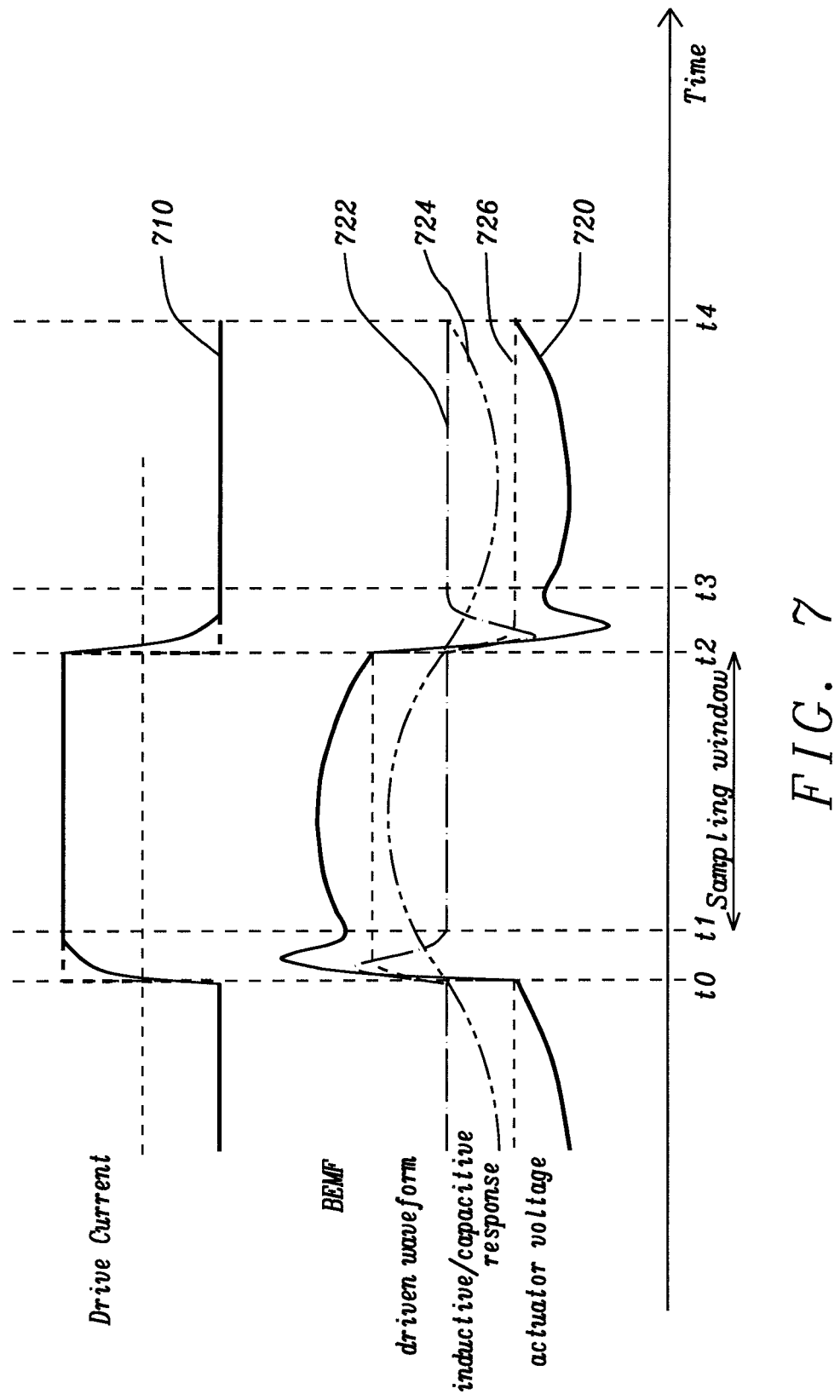
FIG. 7 is a time chart showing the waveforms of a drive signal and a response signal of a haptic actuator.

FIG. 7 shows the waveforms of a drive signal 710, and a response signal 720, also referred to as output voltage Vout. The response signal 720 comprises an inductive component 722, a BEMF component 724, and a drive signal component 726.

In this example, the drive signal 710 is current drive signal having a square wave profile. For example, the output current may change polarity between −50 mA and +50 mA. The dotted line represents the intended drive waveform, and the solid line represent the current as it appears across the actuator due to RC effects. FIG. 7 represents operation of the LRA at or near resonance. In this regime of operation, the current signal 710 changes polarity, at a frequency that is equal or close to the resonant frequency of the haptic actuator. Thus, the back-EMF voltage 724 is in phase with the current drive signal 710.

The output voltage $V_{out}$ 720 across the LRA can be expressed by equation (1) as:

$$V_{out} = IR + \frac{Ldi}{dt} + V_{BEMF},$$

where I is the current drive, R is the resistance of the vibrator, L is the inductance of the LRA and $V_{BEMF}$ is the back-EMF voltage.

A drive period extends between the times t0 and t4. At time to, the current drive 710 starts increasing. Between the times t0 and t1, the current 710 increases from a negative current value to a positive current value. During this time the di/dt component of $V_{out}$ is positive. The output voltage 720 shows a sharp positive spike.

At time t1 the current drive 710 has reached its most positive value. Between times t1 and t2, the current drive 710 remains substantially constant. During this time the di/dt component of $V_{out}$ is zero or close to zero. The IR component of $V_{out}$ is a positive constant value. Therefore, the output voltage 720 corresponds to a positive DC component (IR) added to a positive $V_{BEMF}$ component.

At time t2 the current drive 710 starts decreasing. Between the times t2 and t3, the current decreases from a positive current value to a negative current value. During this time the di/dt component of $V_{out}$ is negative.

At time t3 the current drive 710 has reached its most negative value. Between times t3 and t4, the current drive 710 remains substantially constant. During this time the di/dt component of $V_{out}$ is zero or close to zero. The IR component of $V_{out}$ is a negative constant value. Therefore, the output voltage 720 corresponds to a negative DC component (IR) added to a negative $V_{BEMF}$ component.

FIG. 7 illustrates the case when the haptic actuator is driven at resonance frequency, in this instance the drive signal 710 and the BEMF signal 724 are in phase. If the haptic actuator were driven with an off-frequency, then the shape of the system waveform 720 would change as the BEMF signal 724 becomes out of phase with the drive signal 710.

The output voltage is typically not measured during the time windows t1-t0 and t3-t2, as any measurement performed during these time windows would be corrupted by the settling behaviour of the current regulator and the voltage sensor. Instead measurement of the output voltage is performed outside these time windows.

During the time windows t2-t1 and t4-t3, a voltage sensor can be used to sample the output voltage $V_{out}=IR+V_{BEMF}$. For example, the sensor 615 is a voltage sensor.

The controller 620 receives the output voltage $V_{out}$ then generates one or more control signal to adjust the current signal according to the method described above.

Figure 8:
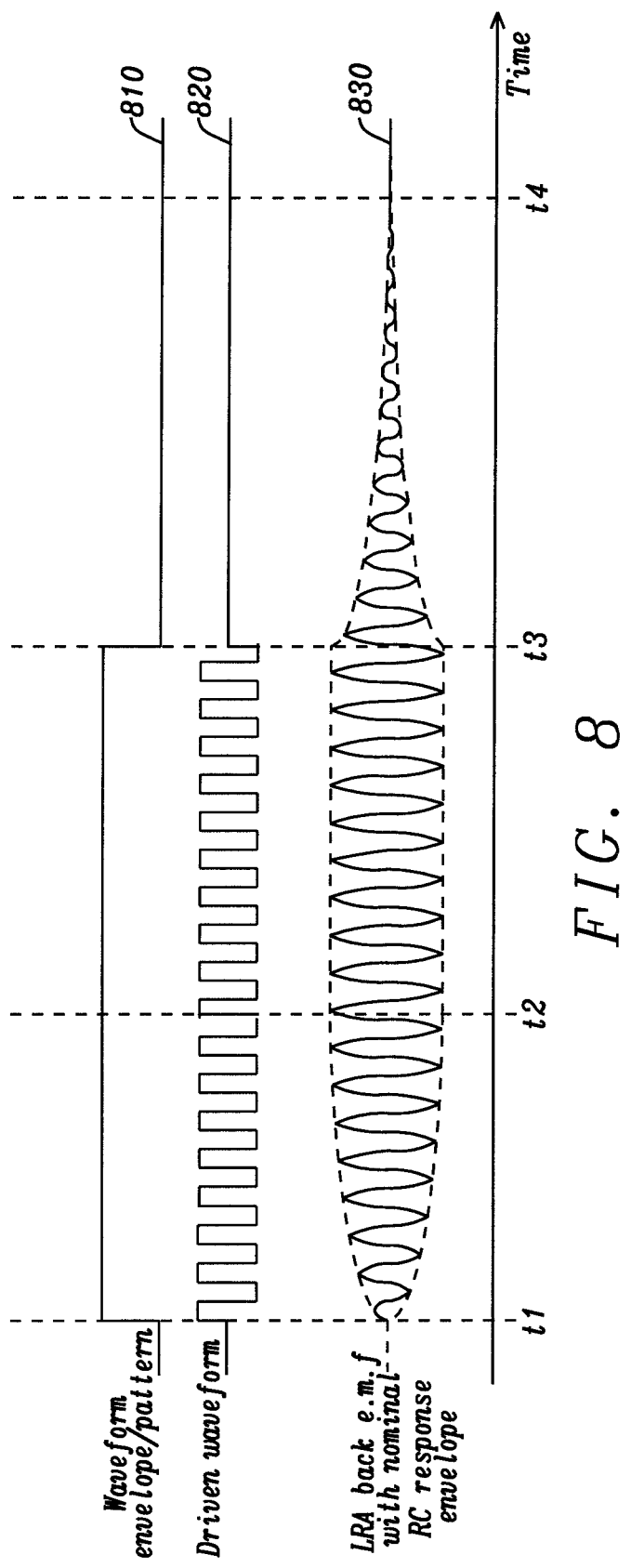
FIG. 8 is time chart illustrating the waveforms of an envelope signal; a drive signal and a BEMF signal.

FIG. 8 illustrates the waveforms of an envelope signal 810; a drive signal 820 and a BEMF signal 830.

The envelop signal 810 generated by the envelope generator 612 modulates the amplitude of the drive signal 820. In this example the drive signal is turned on at time t1 and turned off at time t3.

The BEMF signal 830 is modulated by a response envelope. After time t1, the BEMF signal 830 starts increasing gradually, to reach a maximum target amplitude at time t2. Between times t2 and t3 the maximum amplitude of the BEMF signal remains constant. At time t3 the amplitude of the BEMF signal starts decreasing to reach its minimum target value at time t4.

Figure 9:
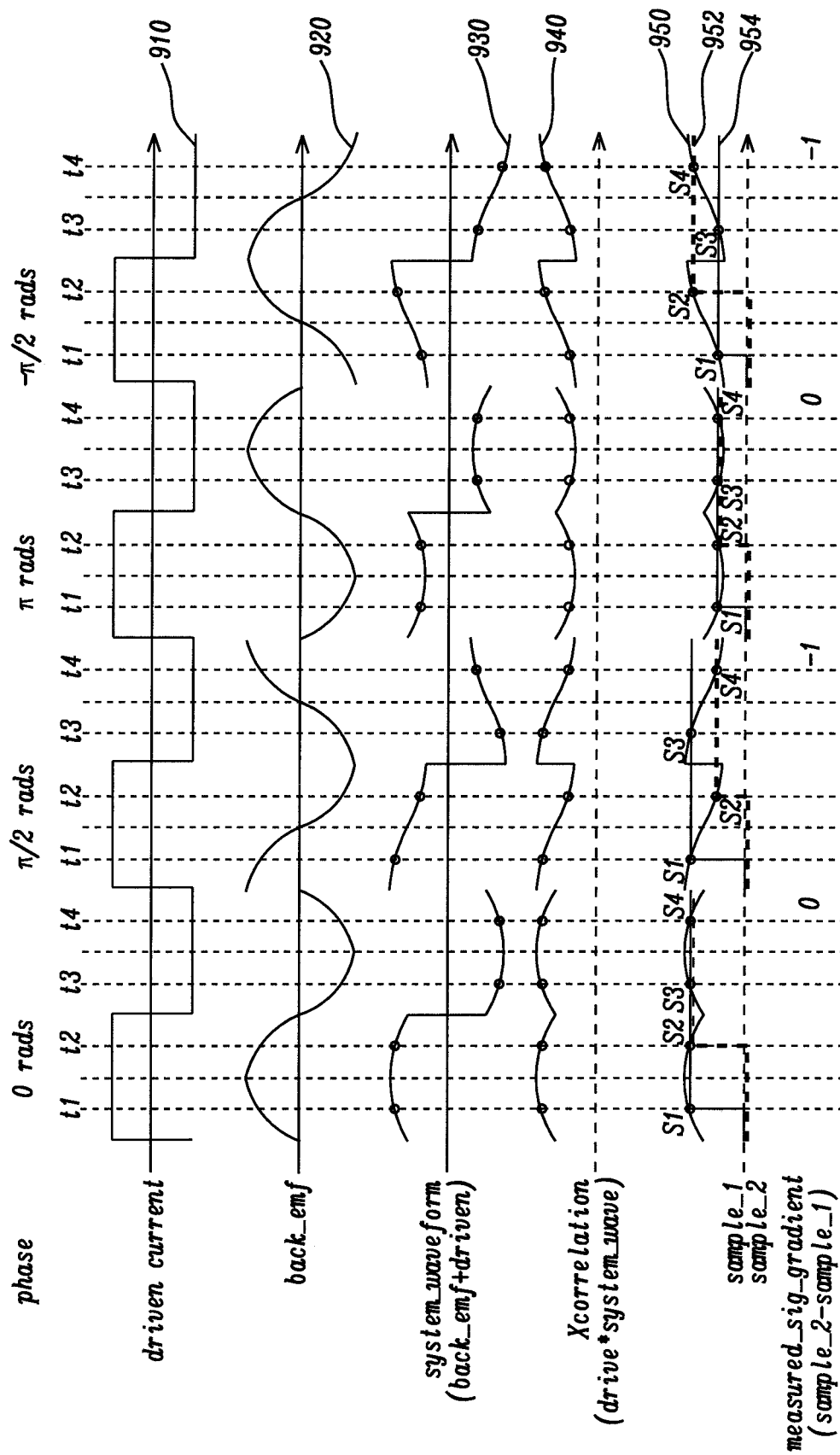
FIG. 9 is time chart illustrating the waveforms of a current drive signal, a BEMF signal, a system waveform, and a correlation signal for different phase states.

FIG. 9 illustrates the waveforms of a current drive signal 910, a BEMF signal 920, a combined drive and BEMF signal 930 also referred to as system waveform, and a product or correlation signal 940 of the drive signal with the BEMF signal. FIG. 9 also shows the slopes calculated between different pairs of measurements on the waveform 940.

In this example the drive signal 910 is a current signal having a square profile and the BEMF signal is a sinusoidal waveform. For clarity, the inductive peaks of the system waveform have been omitted.

FIG. 9 shows how the system waveforms 930 and correlation waveform 940 vary for different phases between the response (BEMF) signal 920 and the drive signal 910; at 0, $$\frac{\pi}{2},$$

π and $$-\frac{\pi}{2}$$

radians.

The system waveform 930 is sampled at points S1, S2 in the positive half-cycle and at points S3, S4 in the negative half-cycle. The points S1 and S2 have a same amplitude value when the phase is zero or π radians and different amplitude values when the phase is $\frac{\pi}{2}$, π and $-\frac{\pi}{2}$ radians.

When the phase is π radians the system is in an unstable state. Any small variation away from this state results in the control signal moving the system towards the 0 radians position. It is therefore possible to identify a phase difference by simply considering the two points S1 and S2.

However, by cross correlating the BEMF signal and the drive signal it is possible to use the four sample points S1, S2, S3 and S4.

A first pair of measurement S1, S2 in the first half-cycle is used to obtain a first difference and a second pair of measurements S3, S4 in the second half-cycle is used to obtain a second difference. The first difference and the second difference are provided as a simple demonstration value 0, +1, or −1. In this example the sign is 0 at 0 rads and π rads, −1 at $\frac{\pi}{2}$ rads, and +1 at $-\frac{\pi}{2}$ rads. The magnitude of the difference between S1 and S2 or between S3 and S4 may also be used to provide a better granularity of control.

In this case, because the response signal is symmetrical, the first difference is equal to the second difference. However, with response signal having a more complex profile, such as the response signal 4b and 4c of FIG. 4, the first difference and the second difference would have different values, but same sign. This approach allows detecting relatively small phase differences with better reliability. It is possible to estimate the phase of the response signal with respect to the drive signal using at least one pair of measurements. Using a greater number of pairs of measurements would allow a better estimate of the phase of the BEMF waveform. However, using a single pair of measurement provides a simple solution which would also consume little energy.

Optionally, the difference calculated by the calculator, for example between two sample measurements or between two pairs of sample measurements can be normalised in order to account for a variation in amplitude of the BEMF signal over time or across actuators. Such a normalisation step may be performed by determining the properties of the actuator to define a nominal maximum BEMF value. This maximum value can then be used to perform normalisation. A local maximum value may also be identified within a half-cycle and used to performed normalisation for a given phase angle. For example, considering a pair of sample measurements S1, S3 and a local maximum S2, it is possible to normalise the difference or gradient between S1 and S3 against the nominal and local value. For example, if S1=0.5, S2=0.6, S3=0.55 and nominal max=1; then Norm(S1)= 0.5*1/0.6 and Norm (S3)=0.55*1/0.6.

Figure 10:
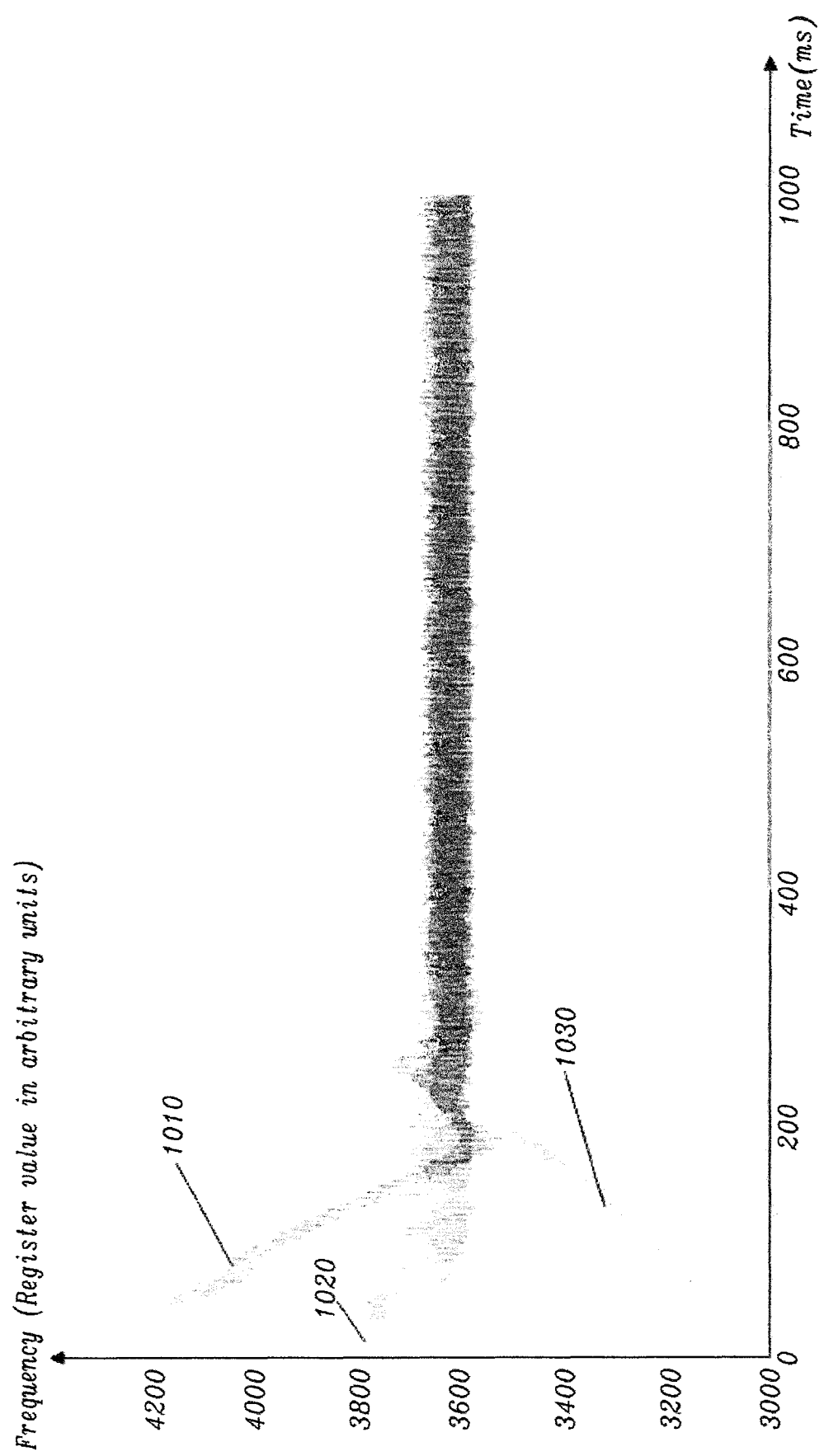
FIG. 10 is a simulation illustrating the frequency of an LRA operated by the control system of FIG. 6.

FIG. 10 is a simulation result illustrating the frequency of an LRA operated by the control system of FIG. 6 for three different starting frequencies. The curve 1010 illustrates a first scenario in which the initial drive frequency is higher than the resonance frequency of the LRA. The curve 1020 illustrates a second scenario in which the initial drive frequency is close to the resonance frequency of the LRA. The curve 1030 illustrates a third scenario in which the initial drive frequency is lower than the resonance frequency of the LRA. The control system tracks the frequency of the response signal and adjusts the drive frequency. In all three scenarios, the haptic system is brought back to a regime of operation in which the haptic actuator operates at resonance frequency within about 300 ms.

Figure 11:
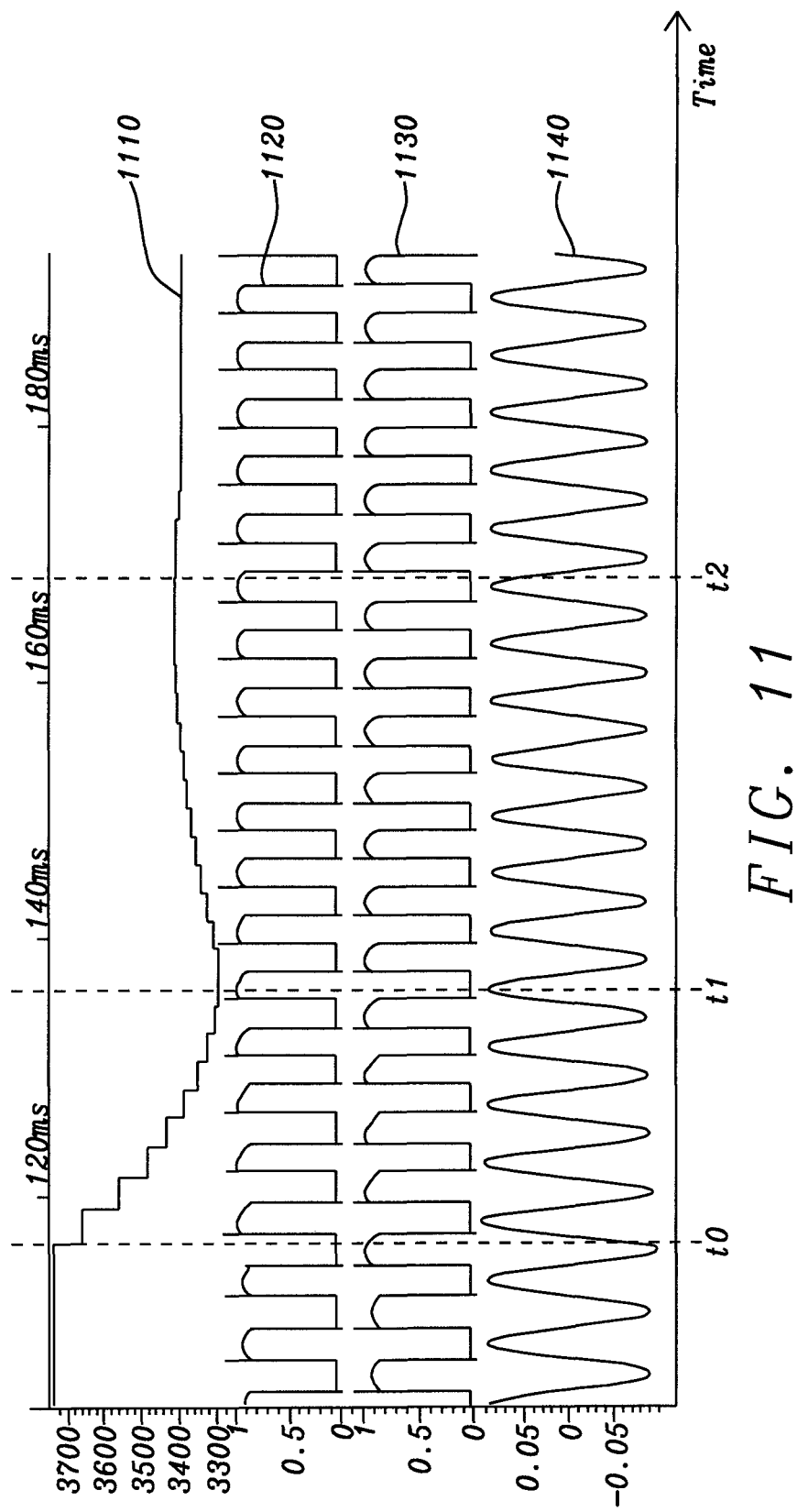
FIG. 11 is a simulation showing the time evolution of the carrier frequency, the voltage at a terminal of a LRA, and the BEMF signal when applying the method of FIG. 2.

FIG. 11 is a simulation showing the carrier frequency 1110, the voltage 1120 at the positive terminal of the LRA, the voltage 1130 at the negative terminal of the LRA and the BEMF signal 1140 extracted from signals 1120 and 1130. At time t0, the carrier frequency is above the target resonance frequency of the LRA. Between t0 and t1, the carrier frequency decreases down to a minimum value that is less than the resonance frequency. Then between t1 and t2 the carrier frequency increases gradually to reach the target resonance frequency at time t2.

Figure 12:
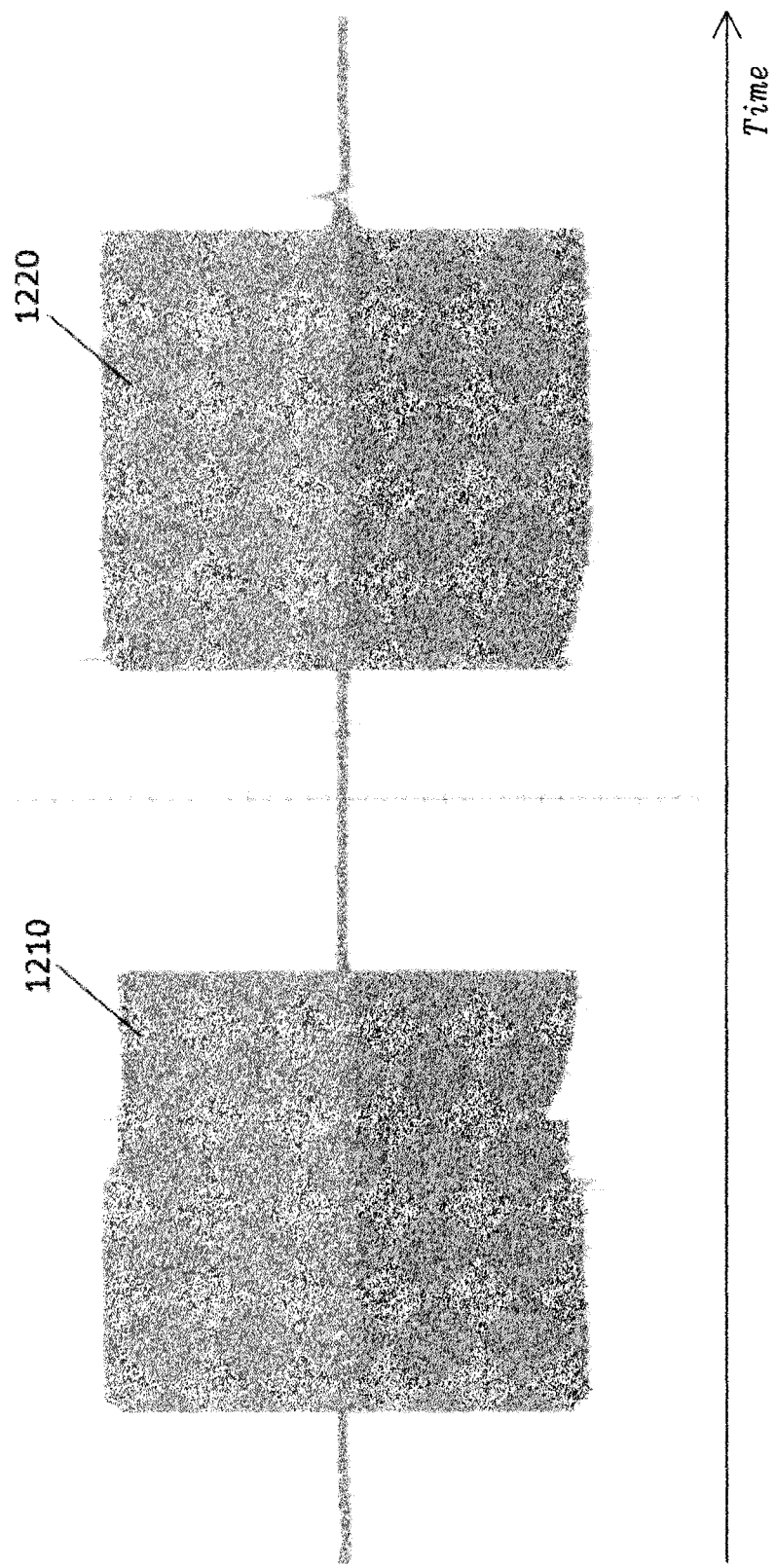
FIG. 12 is the voltage measured across an LRA during a frequency change obtained for a prototyped system with and without frequency tracking.

FIG. 12 shows the voltage measured across an LRA during a frequency change obtained for a prototyped system with and without frequency tracking. The voltage signal includes both the BEMF signal and the voltage developed by the driven current. The first signal 1210 shows the result obtained without frequency tracking. The second signal 1220 shows the result with frequency tracking. A frequency variation of 10% was achieved by changing a nominal frequency set in an FPGA. It can be observed that in the first case, the amplitude of the BEMF signal 1210 falls off when the frequency is changed. In contrast, the amplitude of the BEMF signal 1220 remains substantially constant.

A skilled person will appreciate that variations of the disclosed arrangements are possible without departing from the disclosure. Although the control system of the disclosure has been described with respect to haptic actuators, it may be used with other types of oscillating devices. Accordingly, the above description of the specific embodiment is made by way of example only and not for the purposes of limitation. It will be clear to the skilled person that minor modifications may be made without significant changes to the operation described.

What is claimed is:

1. A frequency controller for use with a driver for providing a drive signal to an oscillating device, and a sensor for sensing an electrical parameter of a response signal of the oscillating device, the controller comprising a calculator adapted to receive a first and a second measurement of the electrical parameter and to calculate an amplitude difference between the first measurement and the second measurement; wherein the first measurement is obtained at a first sampling time and the second measurement is obtained at a second sampling time;

the controller being adapted to provide a control signal to adjust a frequency of the drive signal towards a target frequency based on the amplitude difference.

2. The controller as claimed in claim 1, wherein the first sampling time and the second sampling time are defined with respect to the drive signal.

3. The controller as claimed in claim 2, wherein the first sampling time and the second sampling time are provided within a half-cycle of the drive signal, or wherein the first sampling time is provided within a first half-cycle and wherein the second sampling time is provided within another half-cycle.

4. The controller as claimed in claim 2, wherein the first sampling time and the second sampling time are defined such that the first measurement and the second measurement have a same value when the response signal and the drive signal have a same frequency and are in phase.

5. The controller as claimed in claim 1, wherein the calculator is adapted to calculate a product signal between the drive signal and the response signal; and to sample the product signal at the first sampling time and the second sampling time to obtain the first measurement and the second measurement.

6. The controller as claimed in claim 1, comprising a comparator adapted to compare the difference with a reference value and to generate an error signal based on the comparison.

7. The controller as claimed in claim 6, comprising a control loop coupled to the comparator, the control loop being adapted to generate the control signal to reduce the error signal.

8. The controller as claimed in claim 1, comprising a normaliser coupled to the calculator to normalise the difference.

9. The controller as claimed in claim 1, wherein the response signal comprises a feedback component.

10. A control system for use with an oscillating device comprising a response signal, the control system comprising
a driver adapted to provide a drive signal to the oscillating device;
a sensor adapted to sense an electrical parameter of the response signal at a plurality of sampling times associated with a sampling pattern;
a controller coupled to the sensor and to the driver, the controller comprising a calculator adapted to receive a first and a second measurement of the electrical parameter and to calculate an amplitude difference between the first measurement and the second measurement; wherein the first measurement is obtained at a first sampling time and the second measurement is obtained at a second sampling time; the controller being adapted to provide a control signal to adjust a frequency of the drive signal towards a target frequency based on the amplitude difference.

11. The control system as claimed in claim 10, wherein the sampling pattern comprises at least the first sampling time and the second sampling time, and wherein the first sampling time and the second sampling time are defined with respect to the drive signal.

12. The control system as claimed in claim 11, wherein the first sampling time and the second sampling time are provided within a half-cycle of the drive signal; or wherein the first sampling time is provided within a first half-cycle and wherein the second sampling time is provided within another half-cycle.

13. The control system as claimed in claim 11, wherein the first sampling time and the second sampling time are defined such that the first measurement and the second measurement have a same value when the response signal and the drive signal have a same frequency and are in phase.

14. The control system as claimed in claim 10, wherein the calculator is adapted to calculate a product signal between the drive signal and the response signal; and to sample the product signal at the first sampling time and the second sampling time to obtain the first measurement and the second measurement.

15. The control system as claimed in claim 10, comprising a comparator adapted to compare the difference with a reference value and to generate an error signal based on the comparison, and a control loop coupled to the comparator, the control loop being adapted to generate the control signal to reduce the error signal.

16. The control system as claimed in claim 10, wherein the driver is a current driver adapted to provide a current signal and wherein the sensor is a voltage sensor.

17. An oscillating-device system comprising a control system coupled to an oscillating device having a response signal, the control system comprising a driver adapted to provide a drive signal to the oscillating device; a sensor adapted to sense an electrical parameter of the response signal at a plurality of sampling times associated with a sampling pattern; a controller coupled to the sensor and to the driver, the controller comprising a calculator adapted to receive a first and a second measurement of the electrical parameter and to calculate an amplitude difference between the first measurement and the second measurement; wherein the first measurement is obtained at a first sampling time and the second measurement is obtained at a second sampling time; the controller being adapted to provide a control signal to adjust a frequency of the drive signal towards a target frequency based on the amplitude difference.

18. A method of operating an oscillating device adapted to provide a response signal, the method comprising
providing a drive signal having a drive frequency to drive the oscillating device;
defining a sampling pattern comprising at least a first sampling time and a second sampling time;
sensing an electrical parameter of the response signal at the first sampling time to obtain a first measurement;
sensing the electrical parameter at the second sampling time to obtain a second measurement;
calculating an amplitude difference between the first measurement and the second measurement; and
adjusting the drive signal based on the amplitude difference.

19. The method as claimed in claim 18, wherein adjusting the drive signal comprises generating a control signal to change the drive frequency to a target frequency.

20. The method as claimed in claim 19, wherein the control signal is adapted to reduce the difference between the first measurement and the second measurement.

21. The method as claimed in claim 18, wherein the sampling pattern comprises at least the first sampling time and the second sampling time, and wherein the first sampling time and the second sampling time are defined with respect to the drive signal.

22. The method as claimed in claim 21, wherein the first sampling time and the second sampling time are provided within a half-cycle of the drive signal or wherein the first sampling time is provided within a first half-cycle and wherein the second sampling time is provided within another half-cycle.

23. The method as claimed in claim 21, wherein the first sampling time and the second sampling time are defined such that the first measurement and the second measurement have a same value when the response signal and the drive signal have a same frequency and are in phase.

24. The method as claimed in claim 18, comprising calculating a product signal between the drive signal and the response signal; and sampling the product signal at the first sampling time and the second sampling time to obtain the first measurement and the second measurement.

25. The method as claimed in claim 18 wherein the drive frequency is a resonance frequency of the oscillating device.

26. The method as claimed in claim 18, comprising normalising the difference to obtain a normalised difference and adjusting the drive signal based on the normalised difference.

* * * * *